United States Patent
Tanikella et al.

(10) Patent No.: US 7,956,356 B2
(45) Date of Patent: Jun. 7, 2011

(54) SAPPHIRE SUBSTRATES AND METHODS OF MAKING SAME

(75) Inventors: Brahmanandam V. Tanikella, Northboro, MA (US); Matthew A. Simpson, Sudbury, MA (US); Palaniappan Chinnakaruppan, Springboro, OH (US); Robert A. Rizzuto, Worcester, MA (US); Isaac K. Cherian, Shrewsbury, MA (US); Ramanujam Vedantham, Worcester, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 421 days.

(21) Appl. No.: 11/963,369

(22) Filed: Dec. 21, 2007

(65) Prior Publication Data

US 2008/0164578 A1    Jul. 10, 2008

Related U.S. Application Data

(60) Provisional application No. 60/882,343, filed on Dec. 28, 2006.

(51) Int. Cl.
*H01L 29/10* (2006.01)

(52) U.S. Cl. .................................... 257/43; 257/E29.1
(58) Field of Classification Search .................. 257/43
See application file for complete search history.

(56) References Cited

U.S. PATENT DOCUMENTS

| | | | |
|---|---|---|---|
| 5,413,951 A * | 5/1995 | Ohori et al. | 438/479 |
| 5,506,433 A * | 4/1996 | Ohori et al. | 257/347 |
| 6,019,668 A | 2/2000 | Ramanath et al. | |
| 6,093,092 A | 7/2000 | Ramanath et al. | |
| 6,102,789 A | 8/2000 | Ramanath et al. | |
| 6,346,036 B1 | 2/2002 | Halley | |
| 6,361,647 B1 | 3/2002 | Halley | |
| 6,394,888 B1 | 5/2002 | Matsumoto et al. | |
| 6,685,755 B2 | 2/2004 | Ramanath et al. | |
| 6,755,729 B2 | 6/2004 | Buljan et al. | |
| 6,875,082 B2 * | 4/2005 | Nakayama et al. | 451/36 |
| 6,921,719 B2 | 7/2005 | Paterson et al. | |
| 7,098,152 B2 * | 8/2006 | Moore | 438/782 |
| 7,115,480 B2 * | 10/2006 | Forbes | 438/457 |
| 7,315,019 B2 * | 1/2008 | Turner et al. | 250/251 |
| 7,439,158 B2 * | 10/2008 | Forbes et al. | 438/450 |
| 2002/0052169 A1 | 5/2002 | Vepa et al. | |

(Continued)

FOREIGN PATENT DOCUMENTS

EP    0221454 B1    5/1987

(Continued)

OTHER PUBLICATIONS

Y. Choi, et al., "Sapphire substrate-transferred nitride-based light-emitting diode fabricated by sapphire wet etching technique," Solid-State Electronics, vol. 50, pp. 1522-1528, 2006.

(Continued)

*Primary Examiner* — David A Zarneke
(74) *Attorney, Agent, or Firm* — Abel Law Group, LLP

(57) ABSTRACT

A sapphire substrate includes a generally planar surface having a crystallographic orientation selected from the group consisting of a-plane, r-plane, m-plane, and c-plane orientations, and having a nTTV of not greater than about 0.037 $\mu m/cm^2$, wherein nTTV is total thickness variation normalized for surface area of the generally planar surface, the substrate having a diameter not less than about 9.0 cm.

26 Claims, 5 Drawing Sheets

U.S. PATENT DOCUMENTS

| | | | |
|---|---|---|---|
| 2002/0151265 A1 | 10/2002 | Adefris | |
| 2003/0097800 A1 | 5/2003 | Ramanath et al. | |
| 2004/0082278 A1 | 4/2004 | Enomoto et al. | |
| 2004/0087146 A1 | 5/2004 | Paterson et al. | |
| 2005/0193942 A1 | 9/2005 | Gorgoni et al. | |
| 2005/0227591 A1 | 10/2005 | Enomoto et al. | |
| 2006/0130767 A1 | 6/2006 | Herchen | |
| 2006/0172663 A1 | 8/2006 | Zhang | |
| 2007/0023395 A1 | 2/2007 | Asakawa | |
| 2008/0075941 A1 | 3/2008 | Tatartchenko et al. | |

FOREIGN PATENT DOCUMENTS

| | | | |
|---|---|---|---|
| EP | 1577933 A | 9/2005 | |
| JP | 11-045892 A | 2/1999 | |
| WO | 2006/031641 A | 3/2006 | |
| WO | 2006119927 A | 11/2006 | |
| WO | 2008/083071 A1 | 7/2008 | |

OTHER PUBLICATIONS

Anonymous, "Sappire Wafer," Semiconductor Wafer, Inc. Product Information, [Online] 2002, SP002493933.

Yuasa T. et al., "Effect of Slight Misorientation of Sapphire Substrate on Metalorganic Chemical Vapor Deposition Growth of GaN," Japanese Journal of Applied Physics, Japan Society of Applied Physics, Tokyo, JP, vol. 38, No. 7A, Part 02, Jul. 1, 1999, pp. L703-L705, XP000902425.

Someya T. et al., "Misorientation-angle dependence of GaN layers grown on a-plane sapphire substrates by metalorganic chemical vapor deposition," Applied Physics Letters, AIP, American Institute of Physics, Melfville, NY, vol. 79, No. 13, Sep. 24, 2001, pp. 1992-1994, XP012028969.

Lud D. et al., "Sapphire substrate misorientation effects on GaN nucleation layer properties," Journal of Crystal Growth, Elsevier, Amsterdam, NL, vol. 272, No. 1-4, Dec. 10, 2004, pp. 353-359, XP004658496.

Grudowski P.A., et al., "The Effect of substrate misorientation on the photoluminescence properties of GaN grown on sapphire by metalorganic chemical vapor depositionn," Applied Physics Letters, AIP, American Institute of Physics, Melville NY, vol. 69, No. 24, Dec. 9, 1996, p. 3626, XP012016766.

Kim et al., "The effect of a slight mis-orientation angle of c-plane sapphire substrate on surface and crystal quality of MOCVD grown GaN thin film.", Phys State Sol, vol. 1, No. 10, pp. 2483-2486, 2004.

Harman et al., "R.F. Sputtered Silicon Films on Sapphire," Thin Solid Filsm, vol. 32, pp. 55-59, 1976.

* cited by examiner

SAPPHIRE SUBSTRATES AND METHODS OF MAKING SAME

CROSS-REFERENCE TO RELATED APPLICATION(S)

The present application claims priority from U.S. Provisional Patent Application No. 60/882,343, filed Dec. 28, 2006, entitled "SAPPHIRE SUBSTRATES AND METHODS OF MAKING SAME", naming inventors Brahmanandam V. Tanikella, Matthew A. Simpson, Palani Chinnakaruppan, Robert A. Rizzuto, Isaac K. Cheman, and Rama Vedantham, which application is incorporated by reference herein in its entirety.

BACKGROUND

1. Field of the Disclosure

The present application is generally directed to sapphire substrates and methods of finishing such substrates.

2. Description of the Related Art

Semiconducting components based on single crystal nitride materials of Group-III and Group-V elements are ideal for devices such as light-emitting diodes (LED), laser diodes (LD), displays, transistors and detectors. In particular, semiconductor elements utilizing Group-III and Group-V nitride compounds are useful for light emitting devices in the UV and blue/green wavelength regions. For example, gallium nitride (GaN) and related materials such as AlGaN, InGaN and combinations thereof, are the most common examples of nitride semiconductor materials in high demand.

However, manufacturing boules and substrates of such nitride semiconducting materials has proven difficult for a multitude of reasons. Accordingly, epitaxial growth of nitride semiconducting materials on foreign substrate materials is considered a viable alternative. Substrates including SiC (silicon carbide), $Al_2O_3$ (sapphire or corundum), and $MgAl_2O_4$ (spinel) are common foreign substrate materials.

Such foreign substrates have a different crystal lattice structure than nitride semiconducting materials, particularly GaN, and thus have a lattice mismatch. Despite such mismatch and attendant problems such as stresses and defectively in the overlying semiconductor materials layer, the industry demands large surface area, high quality substrates, particularly sapphire substrates. However, challenges remain with the production of high quality substrates in larger sizes.

SUMMARY

One embodiment is drawn to a sapphire substrate including a generally planar surface having a crystallographic orientation selected from the group consisting of a-plane, r-plane, m-plane, and c-plane orientation, and having a nTTV of not greater than about 0.037 $\mu m/cm^2$, wherein nTTV is total thickness variation normalized for surface area of the generally planar surface, the substrate having a diameter not less than about 9.0 cm.

Another embodiment is drawn to a sapphire substrate including a generally planar surface having a crystallographic orientation selected from the group consisting of a-plane, r-plane, m-plane, and c-plane orientation, and having a TTV of not greater than about 3.00 μm, wherein TTV is total thickness variation of the generally planar surface. The substrate has a diameter not less than about 6.5 cm and a thickness not greater than about 525 μm.

Another embodiment is drawn to a method of machining a sapphire substrate including grinding a first surface of a sapphire substrate using a first fixed abrasive, and grinding the first surface of the sapphire substrate using a second fixed abrasive. The second fixed abrasive has a smaller average grain size than the first fixed abrasive, and the second fixed abrasive is self-dressing.

Another embodiment is drawn to a method of providing a sapphire substrate lot containing sapphire substrates that includes grinding a first surface of each sapphire substrate using an abrasive such that the first surface has a c-plane orientation, wherein the sapphire substrate lot contains at least 20 sapphire substrates. Each sapphire substrate has a first surface that has (i) a c-plane orientation, (ii) a crystallographic m-plane misorientation angle ($\theta_m$), and (iii) a crystallographic a-plane misorientation angle ($\theta_a$), wherein at least one of (a) a standard deviation $\sigma_m$ of misorientation angle $\theta_m$ is not greater than about 0.0130 and (b) a standard deviation $\sigma_a$ of misorientation angle $\theta_a$ is not greater than about 0.0325.

Another embodiment is drawn to a sapphire substrate lot, including at least 20 sapphire substrates. Each sapphire substrate has a first surface that has (i) a c-plane orientation, (ii) a crystallographic m-plane misorientation angle ($\theta_m$), and (iii) a crystallographic a-plane misorientation angle ($\theta_a$), wherein at least one of (a) a standard deviation $\sigma_m$ of misorientation angle $\theta_m$ is not greater than about 0.0130 and (b) a standard deviation $\sigma_a$, of misorientation angle $\theta_a$ is not greater than about 0.0325.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE EMBODIMENT(S)

According to an aspect, a method is provided that includes the steps of grinding a first surface of a sapphire substrate using a first fixed abrasive and grinding the first surface of the sapphire substrate using a second fixed abrasive. The method further provides that the second fixed abrasive is finer than the first fixed abrasive, such that the second fixed abrasive has a smaller average grain size than the first fixed abrasive, and the second fixed abrasive is a self-dressing abrasive surface.

By way of clarification, abrasives generally can be categorized as free abrasives and fixed abrasives. Free abrasives are generally composed of abrasive grains or grits in powder form, or particulate form in a liquid medium that forms a suspension. Fixed abrasives generally differ from free abrasives in that fixed abrasives utilize abrasive grits within a matrix of material which fixes the position of the abrasive grits relative to each other. Fixed abrasives generally include bonded abrasives and coated abrasives. An example of a coated abrasive is sandpaper; coated abrasives are typically planar sheets (or a geometric manipulation of a planar sheets to form a belt, flaps, or like), that rely on a flexible substrate on which the grits and various size and make coats are deposited. In contrast, bonded abrasives generally do not rely upon such a substrate, and the abrasive grits are fixed in position relative to each other by use of a matrix bond material in which the grits are distributed. Such bonded abrasive components are generally shaped or molded, and heat treated at a cure temperature of the bond matrix (typically above 750° C.) at which the bond matrix softens, flows and wets the grits, and cooled. Various three dimensional forms may be utilized, such as annular, conical, cylindrical, frusto-conical, various polygons, and may form as grinding wheels, grinding blocks, grinding bits, etc. Particular embodiments described herein utilize fixed abrasive components in the form of bonded abrasives.

Figure 1:
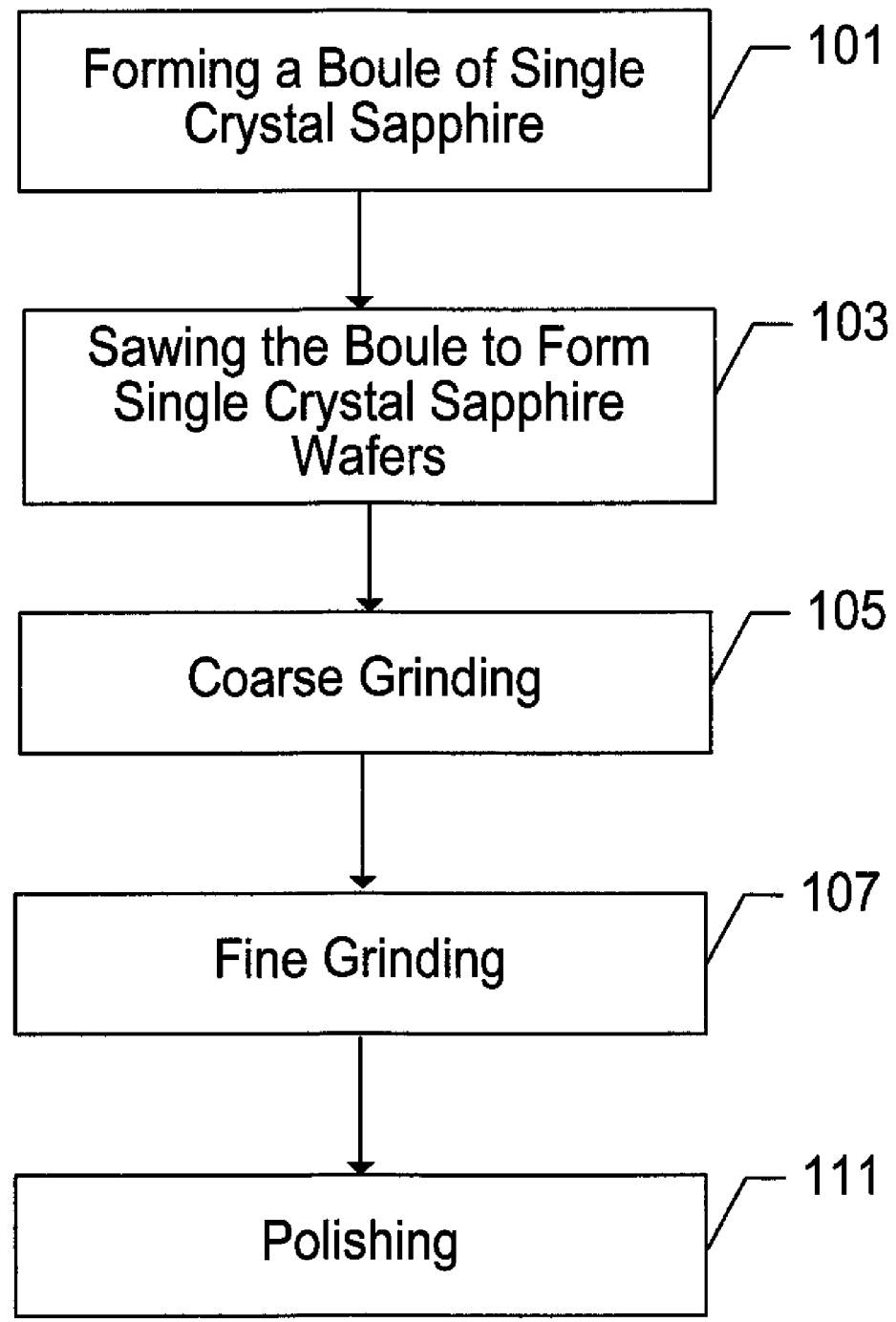
FIG. 1 is a flow chart illustrating a method of forming a substrate according to one embodiment.

Referring to FIG. 1, a method of forming a substrate according to one embodiment is illustrated by a flow chart. The process is initiated by forming a boule of single crystal sapphire at step 101. As will be appreciated, the sapphire can be formed into a blank or a boule having any size or shape suitable for use as a substrate for semiconducting devices, particularly, LED/LD applications. As such, a common shape is a boule having a substantially cylindrical contour. The formation of single crystal sapphire can be accomplished using techniques such as the Czochralski Method, Edge-Defined Film Fed Growth (EFG), or Kyropoulos Method, or other techniques depending upon the desired size and shape of the boule, and the orientation of the crystal.

After forming the single crystal sapphire at step 101, sawing of the boule or blank can be undertaken to section the sapphire and form wafers at step 103. According to a particular embodiment, sawing the sapphire includes wire sawing a sapphire boule having a substantially cylindrical shape. Wire sawing of the sapphire boule provides a plurality of unfinished sapphire wafers. Generally, the duration of the wire sawing process can vary from about a few hours, such as about 2.0 hours to about 30 hours. The desired thickness of the unfinished sapphire wafers can be less than about 10 mm, such as less than about 8.0 mm thick, or less than about 5.0 mm thick. According to one embodiment, the thickness of the sapphire wafers after wire sawing at step 103, is less than about 3.0 mm thick, such as less than about 1.0 mm thick.

According to one embodiment, wire sawing is carried out by using a fixed abrasive wire element or elements, such as an array of wires plated or coated with abrasive grains. In one implementation, a superabrasive, such as cubic boron nitride (CBN) or diamond is coated onto a plurality of wires, and the sapphire boule is rotated at high speeds (e.g., up to 5000 rpm) and pushed against the wire grid, thereby slicing the entire boule in a single step. One example of this technology is non-spooling type wiresawing such as FAST (fixed abrasive slicing technology), offered by Crystal Systems Inc. of Salem, Mass. Another example is spool-to-spool wiresawing systems.

In the case of single crystal raw stock produced by the EFG process, typically in the shape of a ribbon or sheet, the wire sawing process may not be necessary, and cored-out (shaped) wafers can proceed directly to a grinding step.

For clarification, the terms "wafer" and "substrate" are used herein synonymously to refer to sectioned sapphire material that is being formed or processed, to be used as a substrate for epitaxial growth of semiconductor layers thereon, such as to form an optoelectronic device. Oftentimes it is common to refer to an unfinished sapphire piece as a wafer and a finished sapphire piece as a substrate, however, as used herein, these terms do not necessarily imply this distinction.

According to the embodiment illustrated in FIG. 1, after forming a plurality of sapphire wafers via sawing at step 103, the surfaces of the unfinished sapphire wafers can be processed. Typically, one or both major opposing surfaces of the unfinished sapphire wafers can undergo grinding to improve the finish of the surfaces. According to one embodiment, the unfinished sapphire wafers undergo a coarse grinding process at step 105. The coarse grinding step may include grinding both major surfaces of the unfinished sapphire substrates. Generally, the coarse grinding process removes a sufficient amount of material to remove major surface irregularities caused by the wire sawing process, at a reasonably high material removal rate. As such, the coarse grinding process may remove not less than about 30 microns of material from a major surface of the unfinished sapphire substrate, such as not less than about 40 microns, or not less than about 50 microns of material from a major surface of the unfinished sapphire wafers.

Generally, the coarse grinding process can utilize a fixed coarse abrasive that includes coarse abrasive grains in a bond material matrix. The coarse abrasive grains can include conventional abrasive grains such as crystalline materials or ceramic materials including alumina, silica, silicon carbide, zirconia-alumina and the like. In addition to or alternatively, the coarse abrasive grains can include superabrasive grains, including diamond, and cubic boron nitride, or mixtures thereof. Particular embodiments take advantage of superabrasive grains. Those embodiments utilizing superabrasive grains can utilize non-superabrasive ceramic materials such as those noted above as a filler material.

In further reference to the coarse abrasive, the coarse abrasive grains can have a mean particle size of not greater than about 300 microns, such as not greater than about 200 microns, or even not greater than about 100 microns. According to a particular embodiment, the mean particle size of the coarse abrasive grains is within a range of between about 2.0 microns and about 300 microns, such as within a range of between about 10 microns and 200 microns, and more particularly within a range of between about 10 microns and 100 microns. Typical coarse grains have a mean particle size within a range of about 25 microns to 75 microns.

As described above, the coarse abrasive includes a bond material matrix. Generally, the bond material matrix can include a metal or metal alloy. Suitable metals include iron, aluminum, titanium, bronze, nickel, silver, zirconium, alloys thereof and the like. In one embodiment, the coarse abrasive includes not greater than about 90 vol % bond material, such as not greater than about 85 vol % bond material. Typically, the coarse abrasive includes not less than about 30 vol % bond material, or even not less than about 40 vol % bond material. In a particular embodiment, the coarse abrasive includes an amount of bond material within a range of between about 40 vol % and 90 vol %. Examples of particular abrasive wheels include those described in U.S. Pat. Nos. 6,102,789; 6,093,092; and U.S. Pat. No. 6,019,668, incorporated herein by reference.

Figure 2:
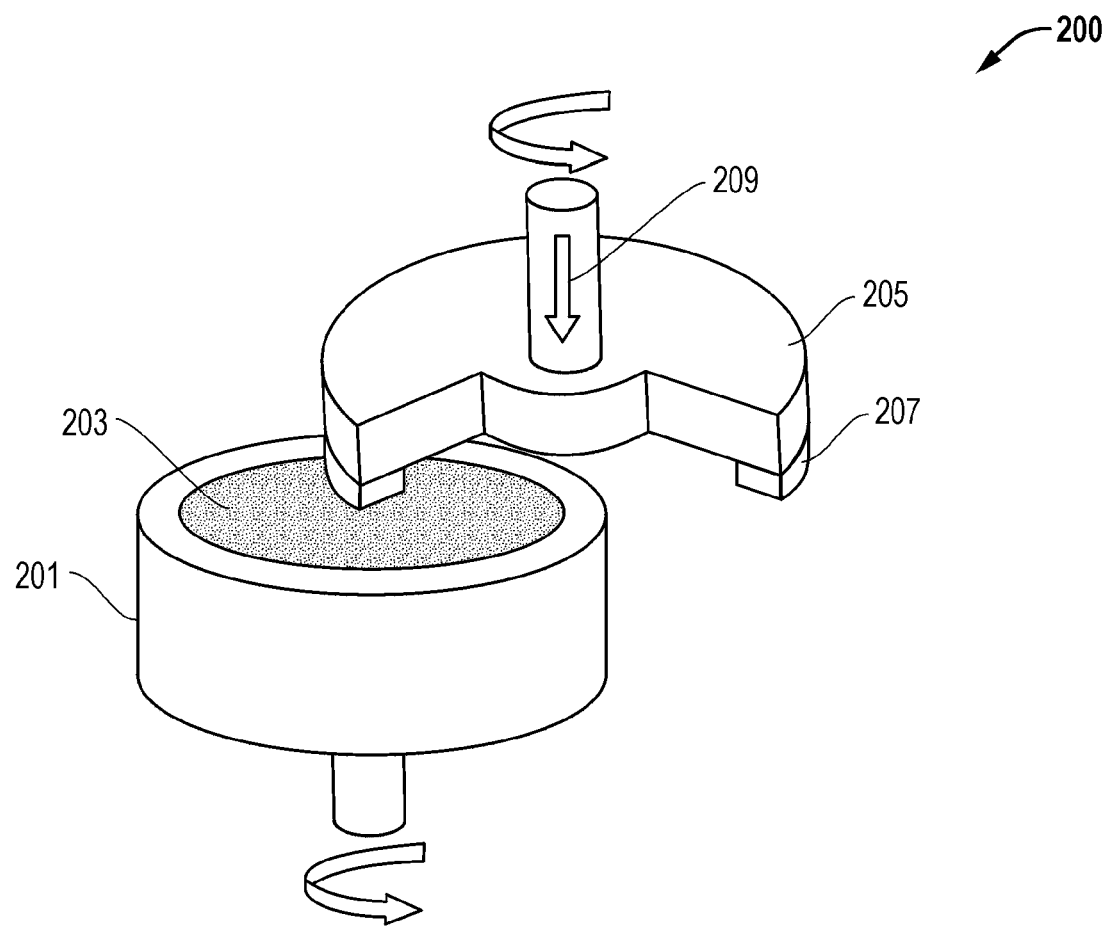
FIG. 2 is an illustration of a grinding apparatus according to one embodiment.

Generally, the coarse grinding process includes providing an unfinished sapphire wafer on a holder and rotating the sapphire wafer relative to a coarse abrasive surface. Referring briefly to FIG. 2, a diagram of a typical grinding apparatus 200 is illustrated, shown in partial cut-away schematic form. The grinding apparatus 200 can include an unfinished wafer 203 provided on a holder 201, such that the wafer 203 is at least partially recessed into the holder 201. The holder 201 can be rotated, thus rotating the unfinished wafer 203. A grinding wheel 205 (shown in cut-away form) having an abrasive rim 207, can be rotated relative to the unfinished wafer 203 thus grinding the surface of the unfinished wafer; the wafer 203 and the grinding wheel 205 may be rotated about the same direction (e.g., both clockwise or counterclockwise), while grinding is effected due to the offset rotational axes. As illustrated, in addition to rotating the grinding wheel 205, a downward force 209 can be applied to the grinding wheel 203.

As illustrated, the coarse abrasive can be an abrasive wheel having a substantially circular abrasive rim 207 around a perimeter of an inner wheel. According to one embodiment, the fine grinding process includes rotating the abrasive wheel at a speed of greater than about 2000 revolutions per minute (rpm), such as greater than about 3000 rpm, such as within a range of 3000 to 6000 rpm. Typically, a liquid coolant is used, including aqueous and organic coolants.

In a particular embodiment, a self-dressing coarse abrasive surface is utilized. Unlike many conventional fixed abrasives, a self-dressing abrasive generally does not require dressing or additional conditioning during use, and is particularly suitable for precise, consistent grinding. In connection with self-dressing, the bond material matrix may have particular composition, porosity, and concentration relative to the grains, to achieve desired fracture of the bond material matrix as the abrasive grains develop wear flats. Here, the bond material matrix fractures as wear flats develop due to increase in loading force of the matrix. Fracture desirably causes loss of the worn grains, and exposes fresh grains and fresh cutting edges associated therewith. In particular, the bond material matrix of the self-dressing coarse abrasive can have a fracture toughness less than about 6.0 MPa-m$^{1/2}$, such as less than about 5.0 MPa-m$^{1/2}$, or particularly within a range of between about 1.0 MPa-m$^{1/2}$ and 3.0 MPa-m$^{1/2}$.

Generally, a self-dressing coarse abrasive partially replaces the bond material with pores, typically interconnected porosity. Accordingly, the actual content of the bond material is reduced over the values noted above. In one particular embodiment, the coarse abrasive has a porosity not less than about 20 vol %, such as not less than about 30 vol %, with typical ranges between about 30 vol % and about 80 vol %, such as about 30 vol % to about 80 vol % and about 30 vol % to about 70 vol %. According to one embodiment, the coarse abrasive includes about 50 vol % to about 70 vol % porosity. It will be appreciated that, the porosity can be open or closed, and in coarse abrasives that have a greater percentage of porosity, generally the porosity is open, interconnected pores. The size of the pores can generally be within a range of sizes between about 25 microns to about 500 microns, such as between about 150 microns to about 500 microns. The foregoing pore-related values and those described herein are made in connection with various components pre-machining or pre-grinding.

According to one embodiment, the coarse abrasive grain content is confined in order to further improve self-dressing capabilities. For example, the coarse abrasive contains not greater than about 50 vol %, not greater than 40 vol %, not greater than 30 vol %, such as not greater than about 20 vol %, or even not greater than about 10 vol % coarse abrasive grains. In one particular embodiment, the coarse abrasive includes not less than about 0.5 vol % and not greater than about 25 vol % coarse abrasive grains, such as within a range of between about 1.0 vol % and about 15 vol % coarse abrasive grains, or particularly within a range of between about 2.0 vol % and about 10 vol % coarse abrasive grains.

Figure 3A:
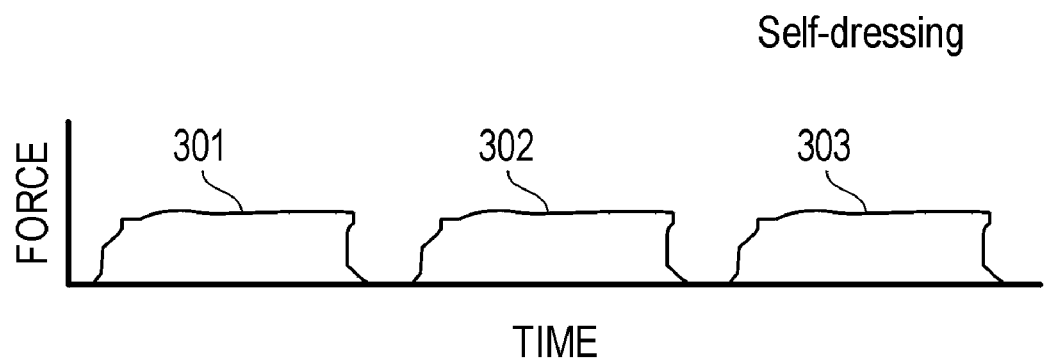
FIG. 3a includes a plot of normal force applied to the grinding wheel as a function of grinding time for a self-dressing abrasive according to an embodiment, and FIG. 3b includes a plot of normal force applied to a grinding wheel as a function of grinding time for a traditional abrasive.
Figure 3B:
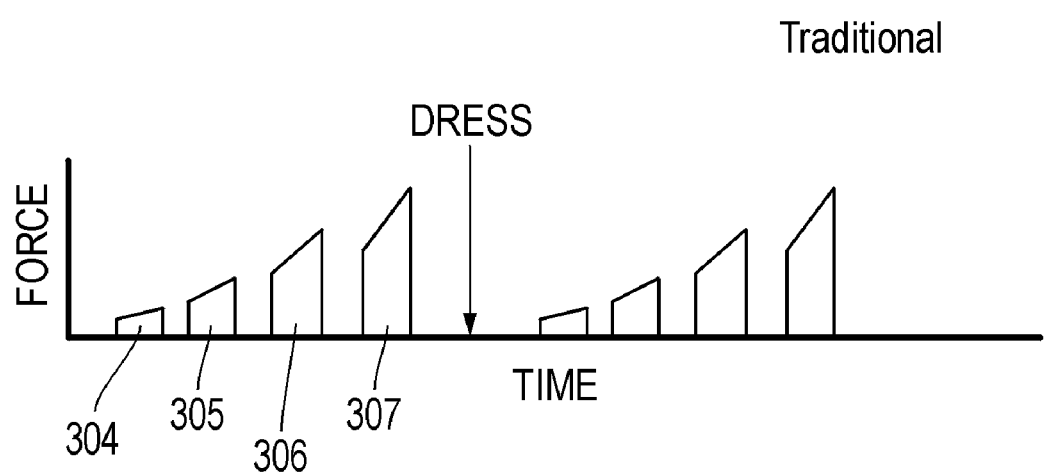

Referring briefly to FIG. 3, two plots are illustrated that compare the normal force applied to the grinding wheel as a function of grinding time between a self-dressing abrasive surface and a traditional abrasive surface. As illustrated, the self-dressing abrasive has a substantially constant peak normal force during each of the three illustrated grinding operations 301, 302, and 303 (301-303). In addition, the peak normal force is not substantially different between each of the grinding operations 301-303. In contrast, the traditional abrasive surface illustrates an increase in the force necessary to effectively grind a surface between individual grinding operations 304, 305, 306, and 307 (304-307) as well as during each of the individual grinding operations 304-307. Such normal force increases during grinding is more likely to cause notable surface and subsurface defects (high defect density) and inconsistent grinding, even with frequent dressing operations.

According to one embodiment, the peak normal force during grinding using the self-dressing coarse abrasive includes applying a force normal to the substrate surface of not greater than about 200 N/mm width (as measured along the contact area between the substrate and grinding wheel) for the duration of the grinding operation. In another embodiment, the peak normal force applied is not greater than about 150 N/mm width, such as not greater than about 100 N/mm width, or even not greater than about 50 N/mm width for the duration of the grinding operation.

After coarse grinding, the wafers typically have an average surface roughness $R_a$ of less than about 1 micron. Typically, fine grinding is then carried out not only to improve macroscopic features of the substrate, including flatness, bow, warp, total thickness variation, and surface roughness, but also finer scale defects such as reduction in subsurface damage such as damaged crystallinity, including particularly reduction or removal of crystalline dislocations.

In some circumstances, the first coarse grinding step may be omitted or replaced by lapping, which utilizes a free abrasive typically in the form of a slurry. In such a case, the second grinding operation utilizes the self-dressing fixed abrasive noted above.

Turning back to the embodiment illustrated in FIG. 1, upon completion of coarse grinding at step 105, the sapphire wafers can be subject to a fine grinding process at step 107. The fine grinding process generally removes material to substantially remove defects caused by the coarse grinding process 105. As such, according to one embodiment, the fine grinding process removes not less than about 5.0 microns of material from a major surface of the sapphire substrate, such as not less than about 8.0 microns, or not less than about 10 microns of material from a major surface of the sapphire wafers. In another embodiment, more material is removed such that not less than about 12 microns, or even not less than about 15 microns of material is removed from a surface of the sapphire substrate. Typically, fine grinding at step 107 is undertaken on one surface, as opposed to the coarse grinding process at step 105 which can include grinding both major surfaces of the unfinished sapphire wafers.

The fine abrasive can utilize a fixed fine abrasive that includes fine abrasive grains in a bond material matrix. The fine abrasive grains can include conventional abrasive grains such as crystalline materials or ceramic materials including alumina, silica, silicon carbide, zirconia-alumina or superabrasive grains such as diamond and cubic boron nitride, or mixtures thereof. Particular embodiments take advantage of superabrasive grains. Those embodiments utilizing superabrasive grains can utilize non-superabrasive ceramic materials such as those noted above as a filler material.

According to one embodiment, the fine abrasive contains not greater than about 50 vol %, not greater than 40 vol %, not greater than 30 vol %, such as not greater than about 20 vol %, or even not greater than about 10 vol % fine abrasive grains. In one particular embodiment, the fine abrasive includes not less than about 0.5 vol % and not greater than about 25 vol % fine abrasive grains, such as within a range of between about 1.0 vol % and about 15 vol % fine abrasive grains, or particularly within a range of between about 2.0 vol % and about 10 vol % fine abrasive grains.

In further reference to the fine abrasive, the fine abrasive grains can have a mean particle size of not greater than about 100 microns, such as not greater than about 75 microns, or even not greater than about 50 microns. According to a particular embodiment, the mean particle size of the fine abrasive grains is within a range of between about 2.0 microns and about 50 microns, such as within a range of between about 5 microns and about 35 microns. Generally, the difference in mean particle sizes between the coarse and fine fixed abrasives is at least 10 microns, typically at least 20 microns.

Like the coarse abrasive, the fine abrasive includes a bond material matrix that can include materials such as a metal or metal alloy. Suitable metals can include iron, aluminum, titanium, bronze, nickel, silver, zirconium, and alloys thereof. In one embodiment, the fine abrasive includes not greater than about 70 vol % bond material, such as not greater than about 60 vol % bond material, or still not greater than about 50 vol % bond material. According to another embodiment, the fine abrasive includes not greater than about 40 vol % bond material. Generally, the fine abrasive includes an amount of bond material not less than about 10 vol %, typically not less than 15 vol %, or not less than 20 vol %.

Further, the fine fixed abrasive may include a degree of porosity. In one particular embodiment, the fine abrasive has a porosity not less than about 20 vol %, such as not less than about 30 vol %, with typical ranges between about 30 vol % and about 80 vol %, such as about 50 vol % to about 80 vol % or about 30 vol % to about 70 vol %. According to one embodiment, the fine abrasive includes about 50 vol % to 70 vol % porosity. It will be appreciated that, the porosity can be open or closed, and in fine abrasives that have a greater percentage of porosity, generally the porosity is open, interconnected pores. The size of the pores can generally be within a range of sizes between about 25 microns to about 500 microns, such as between about 150 microns to about 500 microns.

In reference to the fine grinding process at step 107, as mentioned previously, the fine abrasive is self-dressing. Similar to the self-dressing coarse abrasive, the self-dressing fine abrasive includes a bond material matrix, which typically includes a metal having a particular fracture toughness. According to one embodiment, the bond material matrix can have a fracture toughness less than about 6.0 MPa-m$^{1/2}$, such as less than about 5.0 MPa-m$^{1/2}$, or particularly within a range of between about 1.0 MPa-m$^{1/2}$ and about 3.0 MPa-m$^{1/2}$. Self-dressing fine grinding components are described in U.S. Pat. No. 6,755,729 and U.S. Pat. No. 6,685,755, incorporated herein by reference in their entirety.

Generally, the fine grinding process 107 includes an apparatus and process similar to the process described above in conjunction with the coarse grinding process 105. That is, generally, providing an unfinished sapphire wafer on a holder and rotating the sapphire wafer relative to a fine abrasive surface, typically an abrasive wheel, having a substantially circular abrasive rim around a perimeter of an inner wheel. According to one embodiment, the fine grinding process includes rotating the abrasive wheel at a speed of greater than about 2000 revolutions per minute (rpm), such as greater than about 3000 rpm, such as within a range of 3000 to 6000 rpm. Typically, a liquid coolant is used, including aqueous and organic coolants.

As stated above, the fine abrasive can be self-dressing and as such generally has characteristics discussed above in accordance with the self-dressing coarse abrasive. However, according to one embodiment, the peak normal force during fine grinding includes applying a force of not greater than about 100 N/mm width for the duration of the grinding operation. In another embodiment, the peak normal force is not greater than about 75 N/mm width, such as not greater than about 50 N/mm width, or even not greater than about 40 N/mm width for the duration of the grinding operation.

The description of coarse and fine abrasives above refers to the fixed abrasive components of the actual grinding tool. As should be clear, the components may not form the entire body of the tool, but only the portion of the tool that is designed to contact the workpiece (substrate), and the fixed abrasive components may be in the form of segments.

After fine grinding of the unfinished sapphire wafers the wafers typically have an average surface roughness $R_a$ of less than about 0.10 microns, such as less than about 0.05 microns.

After fine grinding the sapphire wafers 107, the wafers can be subjected to a stress relief process such as those disclosed in EP 0 221 454 B1. As described, stress relief may be carried out by an etching or annealing process. Annealing can be carried out at a temperature above 1000° C. for several hours.

Referring again to the embodiment of FIG. 1, after fine grinding at step 107, the ground sapphire wafer can be subjected to polishing at step 111. Generally, polishing utilizes a slurry that is provided between the surface of the wafer and a machine tool, and the wafer and the machine tool can be moved relative to each other to carry out the polishing operation. Polishing using a slurry generally falls into the category of chemical-mechanical polishing (CMP) and the slurry can include loose abrasive particles suspended in a liquid medium to facilitate removal of a precise amount of material from the wafer. As such, according to one embodiment, the polishing process 111 can include CMP using a slurry containing an abrasive and an additive compound, which may function to enhance or moderate material removal. The chemical component may, for example, be a phosphorus compound. Effectively, the abrasive provides the mechanical component, and the additive provides the chemically active component.

The loose abrasive is generally nanosized, and has an average particle diameter less than 1 micron, typically less than 200 nanometers. Typically, the median particle size is within a slightly narrower range, such as within a range of about 10 to about 150 nm. For clarification of technical terms, a median particle size of under about 1 micron generally denotes a polishing process, corresponding to the subject matter hereinbelow, in which a fine surface finish is provided by carrying out the machining operation at low material removal rates. At median particle sizes above about 1.0 micron, such as on the order of about 2.0 to about 5.0 microns, typically the machining operation is characterized as a lapping operation. A particularly useful loose abrasive is alumina, such as in the form of polycrystalline or monocrystalline gamma alumina.

As discussed above, a phosphorus additive may be present in the slurry. Typically, the phosphorus additive is present at a concentration within a range of between about 0.05 to about 5.0 wt %, such as within a range of between about 0.10 wt % to about 3.0 wt %. Particular embodiments utilize a concentration within a slightly narrower range, such as on the order of about 0.10 wt % to about 2.0 wt %. According to one embodiment, the phosphorus compound contains oxygen, wherein oxygen is bonded to the phosphorus element. This class of materials is known as oxophosphorus materials. Particularly, the oxophosphorus compound contains phosphorus in valency state of one, three or five, and in particular embodiments, effective machining has been carried out by utilizing an oxophosphorus compound in which the phosphorus is in a valency state of five.

In other embodiments, the phosphorus can be bonded to carbon in addition to oxygen, which generally denotes organic phosphorus compounds known as phosphonates. Other phosphorus compounds include phosphates, pyrophosphates, hypophosphates, subphosphates, phosphites, pyrophosphites, hypophosphites and phosphonium compounds. Particular species of phosphorus compounds include potassium phosphate, sodium hexametaphosphate, hydroxy phosphono acetic acid (Belcor 575) and aminotri-(methylenephosphonicacid) (Mayoquest 1320).

Generally the slurry containing the abrasive component and the additive containing the phosphorus compound is aqueous, that is, water-based. In fact the slurry generally has a basic pH, such that the pH is greater than about 8.0, such as greater than about 8.5. The pH may range up to a value of about twelve.

Figure 4:
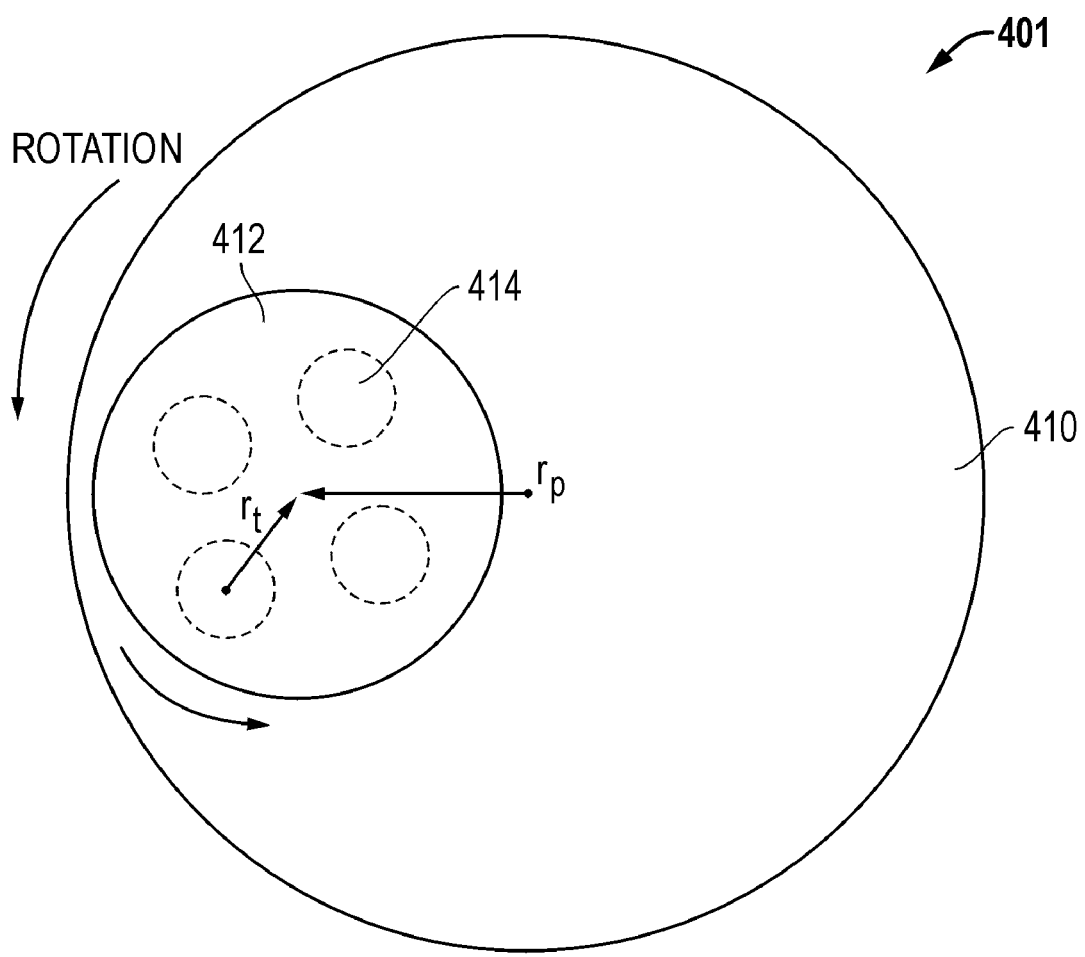
FIG. 4 is an illustration of a polishing apparatus according to one embodiment.

Referring briefly to the apparatus for polishing the ground sapphire wafer, FIG. 4 illustrates a schematic of the basic structure of a polishing apparatus according to one embodiment. The apparatus 401 includes a machine tool, which in this case is formed by a polishing pad 410 and a platen, which supports the polishing pad. The platen and polishing pad 410 are of essentially the same diameter. The platen is rotatable about a central axis, along a direction of rotation as illustrated by the arrow. A template 412 has a plurality of circular indentations which respectively receive substrates 414, the substrates 414 being sandwiched between the polishing pad 410 and the template 412. The template 412, carrying the substrates 414, rotates about its central axis, wherein $r_p$ represents the radius from the center of rotation of the polishing pad to the center of the template 412, whereas $r_t$ represents the radius from an individual substrate to the center of rotation of the template. The configuration of apparatus 401 is a commonly employed configuration for polishing operations, although different configurations may be utilized.

The addition of a phosphorous compound to the slurry generally improves the material removal rate (MRR) over slurries having no phosphorus-based additive. In this regard, the improvement can be indicated by a ratio $MRR_{add}/MRR_{con}$, which according to one embodiment, is not less than about 1.2. The designation $MRR_{add}$ is the material removal rate of a slurry comprising an abrasive and the additive containing the phosphorus compound, whereas $MRR_{con}$ is the material removal rate under identical process conditions with a control slurry, the control slurry being essentially identical to the above-mentioned slurry but being free of the additive containing the phosphorus compound. According to other embodiments, the ratio was greater, such as not less than about 1.5, or even not less than about 1.8, and in some certain samples twice the removal rate over a slurry containing only an alumina abrasive and no phosphorus compound additive.

While the foregoing has focused on various embodiments, including embodiments based on alumina-based polishing slurries, other abrasive materials may be used as well with excellent results, including silica, zirconia, silicon carbide, boron carbide, diamond, and others. Indeed, the zirconia based slurries containing a phosphorus-based compound have demonstrated particularly good polishing characteristics, namely 30-50% improved material removal rates over silica alone on alumina substrates.

According to particular aspect, a high surface area sapphire substrate is provided that includes a generally planar surface having an a-plane orientation, an r-plane orientation, an m-plane orientation, or a c-plane orientation, and which includes controlled dimensionality. As used herein, "x-plane orientation" denotes the substrates having major surfaces that extend generally along the crystallographic x-plane, typically with slight misorientation from the x-plane according to particular substrate specifications, such as those dictated by the end-customer. Particular orientations include the r-plane and c-plane orientations, and certain embodiments utilize a c-plane orientation.

As noted above, the substrate may have a desirably controlled dimensionality. One measure of controlled dimensionality is total thickness variation, including at least one of TTV (total thickness variation) and nTTV (normalized total thickness variation).

For example, according to one embodiment, the TTV is generally not greater than about 3.00 µm, such as not greater than about 2.85 µm, or even not greater than about 2.75 µm. The foregoing TTV parameters are associated with large-sized wafers, and particularly large-sized wafers having controlled thickness. For example, embodiments may have a diameter not less than about 6.5 cm, and a thickness not greater than about 490 µm. According to certain embodiments, the foregoing TTV parameters are associated with notably larger sized wafers, including those having diameters not less than 7.5 cm, not less than 9.0 cm, not less than 9.5 cm, or not less than 10.0 cm. Wafer size may also be specified in terms of surface area, and the foregoing TTV values may be associated with substrates having a surface area not less than about 40 cm$^2$, not less than about 70 cm$^2$, not less than about 80 cm$^2$, or even not less than about 115 cm$^2$. In addition, the thickness of the wafers may be further controlled to values not greater than about 500 µm, such as not greater than about 490 µm.

It is noted that the term 'diameter' as used in connection with wafer, substrate, or boule size denotes the smallest circle within which the wafer, substrate, or boule fits. Accordingly, to the extent that such components have a flat or plurality of flats, such flats do not affect the diameter of the component.

Various embodiments have well controlled nTTV, such as not greater than about 0.037 µm/cm$^2$. Particular embodiments have even superior nTTV, such as not greater than 0.035 µm/cm$^2$, or even not greater than 0.032 µm/cm$^2$. Such controlled nTTV has been particularly achieved with large substrates, such as those having a diameter not less than about 9.0 cm, or even not less than about 10.0 cm. Wafer size may also be specified in terms of surface area, and the foregoing nTTV values may be associated with substrates having a surface area not less than about 90 cm$^2$, not less than about 100 cm$^2$, not less than about 115 cm$^3$.

Referring to the total thickness variation values of the sapphire substrate, TTV is the absolute difference between the largest thickness and smallest thickness of the sapphire substrate (omitting an edge exclusion zone which typically includes a 3.0 mm ring extending from the wafer edge around the circumference of the wafer), and nTTV is that value (TTV) normalized to the surface area of the sapphire substrate. A method for measuring total thickness variation is given in ASTM standard F1530-02.

Generally, the nTTV value, as well as all other normalized characteristics disclosed herein, are normalized for a sapphire substrate having a generally planar surface and substantially circular perimeter which can include a flat for identifying the orientation of the substrate. According to one embodiment, the sapphire substrate has a surface area of not less than about 25 cm², such as not less than about 30 cm², not less than 35 cm² or even not less than about 40 cm. Still, the substrate can have a greater surface area such that the generally planar surface has a surface area not less than about 50 cm², or still not less than about 60 cm², or not less than about 70 cm² The sapphire substrates may have a diameter greater than about 5.0 cm (2.0 inches), such as not less than about 6.0 cm (2.5 inches). However, generally the sapphire substrates have a diameter of 7.5 cm (3.0 inches) or greater, specifically including 10 cm (4.0 inches) wafers.

In further reference to characteristics of the sapphire substrate, according to one embodiment, the generally planar surface of the sapphire substrate has a surface roughness Ra of not greater than about 100.0 Å, such as not greater than about 75.0 Å, or about 50.0 Å, or even not greater than about 30.0 Å. Even superior surface roughness can be achieved, such as not greater than about 20.0 Å, such as not greater than about 10.0 Å, or not greater than about 5.0 Å.

The generally planar surface of the sapphire substrate processed in accordance with the methods described above can have superior flatness as well. The flatness of a surface is typically understood to be the maximum deviation of a surface from a best-fit reference plane (see ASTM F 1530-02). In this regard, normalized flatness is a measure of the flatness of the surface normalized by the surface area on the generally planar surface. According to one embodiment, the normalized flatness (nFlatness) of the generally planar surface is not greater than about 0.100 μm/cm², such as not greater than about 0.080 μm/cm², or even not greater than about 0.070μm/cm². Still, the normalized flatness of the generally planar surface can be less, such as not greater than about 0.060μm/cm², or not greater than about 0.050μm/cm².

Sapphire substrates processed in accordance with methods provided herein can exhibit a reduced warping as characterized by normalized warp, hereinafter nWarp. The warp of a substrate is generally understood to be the deviation of the median surface of the substrate from a best-fit reference plane (see ASTM F 697-92(99). In regards to the nwarp measurement, the warp is normalized to account for the surface area of the sapphire substrate. According to one embodiment, the nwarp is not greater than about 0.190 μm/cm², such as not greater than about 0.170 μm/cm², or even not greater than about 0.150 μm/cm².

The generally planar surface can also exhibit reduced bow. As is typically understood, the bow of a surface is the absolute value measure of the concavity or deformation of the surface, or a portion of the surface, as measured from the substrate centerline independent of any thickness variation present. The generally planar surface of substrates processed according to methods provided herein exhibit a reduced normalized bow (nBow) which is a bow measurement normalized to account for the surface area of the generally planar surface. As such, in one embodiment the nBow of the generally planar surface is not greater than about 0.100 μm/cm², such as not greater than about 0.080 μm/cm², or even not greater than about 0.070 μm/cm². According to another embodiment, the nBow of the substrate is within a range of between about 0.030 μm/cm² and about 0.100 μm/cm², and particularly within a range of between about 0.040 μm/cm² and about 0.090 μm/cm².

In reference to the orientation of the sapphire substrate, as described above, the generally planar surface has a c-plane orientation. C-plane orientation can include a manufactured or intentional tilt angle of the generally planar surface from the c-plane in a variety of directions. In this regard, according to one embodiment, the generally planar surface of the sapphire substrate can have a tilt angle of not greater than about 2.0°, such as not greater than about 1.0°. Typically, the tilt angle is not less than about 0.10°, or not less than 0.15°. Tilt angle is the angle formed between the normal to the surface of the substrate and the c-plane.

Figure 5:
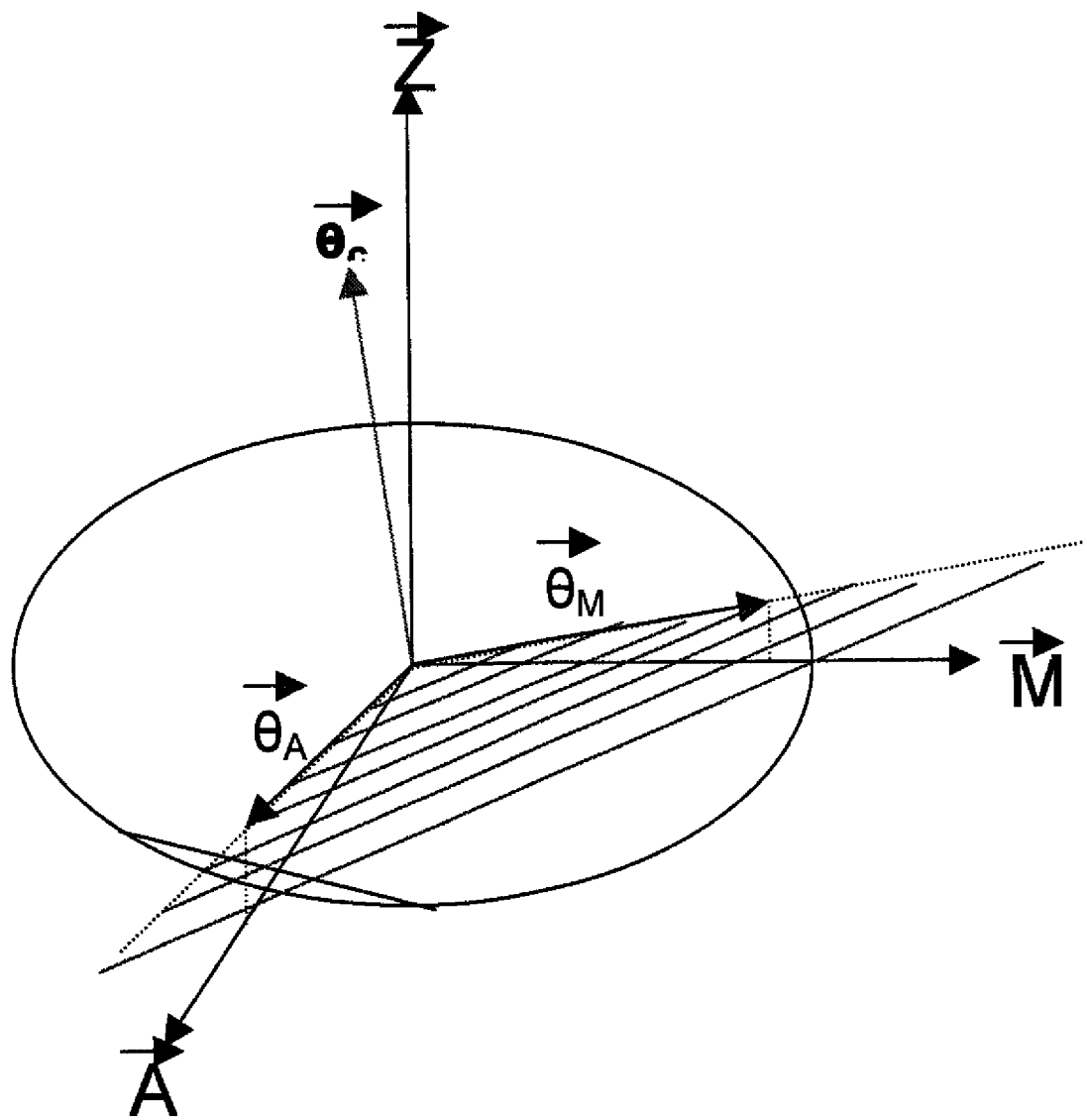
FIG. 5 is an illustration of misorientation angle of a c-plane oriented sapphire substrate.

According to embodiments herein, processing of sapphire wafers desirably results in well controlled wafer-to-wafer precision. More specifically, with respect to c-plane oriented wafers the precise orientation of the wafer surface relative to the c-plane of the sapphire crystal is fixed precisely, particularly as quantified by wafer-to-wafer crystallographic variance. With reference to FIG. 5, Z is a unit normal to the polished surface of the sapphire, and $\theta_A$, $\theta_M$ and $\theta_C$ are orthonormal vectors normal to an a-plane, an m-plane and a c-plane respectively. A and M are projections of $\theta_A$, $\theta_M$ respectively on the plane defined by the sapphire surface ($A=\theta_A-Z(\theta_A \cdot Z)$, $M=\theta_M-Z(\theta_M \cdot Z)$). The misorientation angle in the a-direction is the angle between $\theta_A$ and its projection on the plane containing A and M, and the misorientation angle in the m-direction is the angle between $\theta_M$ and its projection on the plane containing A and M. Misorientation angle standard deviation a is the standard deviation of misorientation angle across a wafer lot, typically at least 20 wafers.

According to embodiments, processing is carried out as described herein, particularly incorporating the grinding process described in detail above, and a lot of sapphire wafers are provided that has precise crystallographic orientation. Substrate lots typically have not fewer than 20 wafers, oftentimes 30 or more wafers, and each lot may have wafers from different sapphire cores or boules. It is noted that a lot may be several sub-lots packaged in separate containers. The wafer lots may have a standard deviation $\sigma_M$ of $\theta_M$ across a wafer lot not greater than about 0.0130 degrees, such as not greater than 0.0110 degrees, or not greater than 0.0080 degrees. The wafer lots may have a standard deviation $\sigma_A$ of $\theta_A$ not greater than about 0.0325 degrees, such as not greater than 0.0310 degrees, or not greater than 0.0280 degrees.

In comparison with prior methods of manufacturing wafers/substrates for LED/LD substrates, present embodiments provide notable advantages. For example, according to several embodiments, utilization of a coarse grinding abrasive (oftentimes a self-dressing coarse fixed abrasive) in conjunction with a self-dressing fine grinding abrasive, as well as particular CMP polishing techniques and chemistries, facilitate production of precision finished sapphire wafers having superior geometric qualities (i.e., nTTV, nWarp, nBow, and nFlatness). In addition to the control of geometric qualities, the processes provided above in conjunction with precision wire sawing facilitates precision oriented crystal wafers having superior control of the tilt angle variation across substrates. In these respects, the improved geometric qualities and precise control of surface orientation from substrate to substrate, facilitates production of consistent LED/LD devices having more uniform light emitting qualities.

Following the various processing steps described herein, the surface of the sapphire substrate subjected to treatment generally has a suitable crystal structure for use in LED/LD devices. For example, embodiments have a dislocation density less than 1E6/cm² as measured by X-ray topographic analysis.

It is particularly noteworthy that dimensional and/or crystallographic orientation control is achieved by embodiments of the invention in connection with large sized substrates and substrates having controlled thickness. In these respect, according to the state of the art, dimensional and crystallographic controls degrade rapidly with increase in wafer size (surface area) for a given thickness. Accordingly, state of the art processing has typically relied on increasing thickness in an attempt to at least partially maintain dimensional and crystallographic control. In contrast, embodiments herein can provide such controls largely independent of thickness and less dependent on wafer or substrate size.

EXAMPLES

The following examples provide methods for processing wafers according to several embodiments, and particularly describe processing parameters for production of high surface area wafers having improved dimensional qualities and orientations. In the following examples, c-plane sapphire wafers having diameters of 2 inches, 3 inches, and 4 inches were processed and formed in accordance with embodiments provided herein.

Processing initiates with a boule that is sectioned or sliced, as described above. The boule is sectioned using a wire sawing technique, wherein the boule is placed and rotated over wires coated with cutting elements, such as diamond particles. The boule is rotated at a high rate of speed, within a range of between about 2000 rpm and 5000 rpm. While the boule is rotating it is in contact with multiple lengths of wiresaw, which are typically reciprocated at a high speed in a direction tangential to the surface of the boule, to facilitate slicing. The lengths of wiresaw are reciprocated at a speed of about 100 cycles/minute. Other liquids can be incorporated, such as a slurry to facilitate slicing. In this instance, the wire sawing process lasts a few hours, within a range of between about 4 to 8 hours. It will be appreciated that the duration of the wire sawing process is at least partially dependent upon the diameter of the boule being sectioned and thus may last longer than 8 hours.

After wire sawing, the wafers have an average thickness of about 1.0 mm or less. Generally, the wafers have an average surface roughness (Ra) of less than about 1.0 micron, an average total thickness variation of about 30 microns, and an average bow of about 30 microns.

After wire sawing the boule to produce wafers, the wafers are subjected to a grinding process. The grinding process includes at least a first coarse grinding process and a second fine grinding process. In regards to the coarse grinding process, a self-dressing coarse grinding wheel is used, such as a PICO type wheel, Coarse #3-17-XL040, manufactured by Saint-Gobain Abrasives, Inc., which incorporates diamond grit having an average grit size within a range of about 60 to 80 microns. For this example, coarse grinding of the wafers is completed using a Strasbaugh 7AF ultra precision grinder. The cycles and parameters of the coarse grinding process are provided in Table 1 below.

In the Tables 1 and 2 below, material is successively removed through a series of iterative grinding steps. Steps 1-3 represent active grinding steps at the indicated wheel and chuck speeds and feed rate. Dwell is carried out with no bias, that is, a feed rate of zero. Further, lift is carried out at a feed rate in the opposite direction, the wheel being lifted from the surface of the substrate at the indicated feed rate.

TABLE 1

| Wheel speed = 2223 rpm | Step 1 | Step 2 | Step 3 | Dwell | Lift |
|---|---|---|---|---|---|
| Material removed (um) | 40 | 5 | 5 | 25 rev | 10 |
| Feed rate (um/s) | 3 | 1 | 1 | | 1 |
| Chuck speed (rpm) | 105 | 105 | 105 | 105 | 105 |

After the coarse grinding process, the wafers are subject to a fine grinding process. The fine grinding process also utilizes a self-dressing wheel, such as an IRIS type wheel Fine #4-24-XL073, manufactured by Saint-Gobain Abrasives, Inc., which utilizes diamond abrasive grit having an average grit size within a range of about 10-25 microns. Again, for the purposes of this example, the fine grinding of the wafers is completed using a Strasbaugh 7AF ultra precision grinder. As with the coarse grinding process, the fine grinding process subject the wafers to particular processing cycles and parameters which are provided in Table 2 below.

TABLE 2

| Wheel speed = 2633 rpm | Step 1 | Step 2 | Step 3 | Dwell | Lift |
|---|---|---|---|---|---|
| Material removed (um) | 10 | 3 | 2 | 55 rev | 5 |
| Feed rate (um/s) | 1 | 0.1 | 0.1 | | 0.5 |
| Chuck speed (rpm) | 55 | 55 | 55 | 55 | 55 |

After the coarse and fine grinding processes, the sapphire wafers are subjected to a stress relief process as described above.

After stress relief, the sapphire wafers are subjected to a final polishing. Several polishing slurries were prepared to investigate the role of pH and phosphates as well as the role of alkali and calcium. Reported below, Table 3 shows enhancements to a baseline slurry, Slurry 1. Polishing was carried out utilizing C-plane sapphire pucks, 2" in diameter, polished on a Buehler ECOMET 4 polisher. Polishing was done on a H2 pad (available from Rohm and Haas Company of Philadelphia, Pa.) with a slurry flow rate of 40 ml/min at a platen speed of 400 rpm, carrier speed of 200 rpm at a downforce of 3.8 psi.

TABLE 3

| Slurry Number | pH | MRR (A/min) | Starting Ra (A) | Ra at 60 min - Center (A) | Ra at 60 minutes - Middle (A) | Ra at 60 minutes - Edge (A) |
|---|---|---|---|---|---|---|
| 1 | 9 | 842 | 7826 | 443 | 100 | 26 |
| 2 | 10 | 800 | 7686 | 481 | 27 | 35 |
| 3 | 11 | 1600 | 7572 | 150 | 10 | 7 |
| 4 | 12 | 1692 | 7598 | 27 | 6 | 8 |
| 5 | 11 | 1558 | 6845 | 26 | 32 | 18 |
| 6 | 11 | 1742 | 8179 | 9 | 13 | 9 |
| 7 | 11 | 1700 | 5127 | 10 | 9 | 10 |
| 8 | 11 | 1600 | 7572 | 150 | 10 | 7 |
| 9 | 11 | 1267 | 7598 | 43 | 51 | 148 |
| 10 | 11 | 1442 | | | | |
| 11 | 11 | 158 | 7572 | 904 | 1206 | 475 |

TABLE 4

| Slurry Number | Chemistry |
|---|---|
| 1 | Alumina slurry at 10% solids with NaOH |
| 2 | Alumina slurry at 10% solids with NaOH |
| 3 | Alumina slurry at 10% solids with NaOH |
| 4 | Alumina slurry at 10% solids with NaOH |
| 5 | Alumina slurry at 10% solids with NaOH plus 1% Sodium Pyrophosphate |
| 6 | Alumina slurry at 10% solids with NaOH plus 1% Dequest 2066 |
| 7 | Alumina slurry at 10% solids with NaOH plus 1% Dequest 2054 |
| 8 | Alumina slurry at 10% solids with NaOH |
| 9 | Alumina slurry at 10% solids with KOH |
| 10 | Alumina slurry at 10% solids with ammonium hydroxide |
| 11 | Alumina slurry at 10% solids with NaOH and 1% calcium chloride |

With respect to the polishing data, as can be seen above in Tables 3 and 4, notable improvements in polishing were found shifting the pH from 9 to 11 as indicated by Slurries 3 and 4. In addition, better surface finishes were found, indicating better productivity. Organic phosphonic acids (Slurries 6 and 7) and inorganic phosphates (Slurry 5) show additional enhancements to surface finish and material removal rate.

Higher alkaline pHs enhance removal rates and finish, and sodium hydroxide shows a suitable route for increased pH (Slurry8) as compared to potassium hydroxide (Slurry 9) and ammonium hydroxide (Slurry 10). Slurry 11 shows a notable affect on moderation of material removal in combination with use of alumina for the abrasive loose abrasive component.

After subjecting the sapphire wafers to processing procedures provided above, characterization of dimensional geometry of the wafers was carried out. Comparative data were generated by comparing the dimensional geometry of sapphire wafers processed according to procedures provided herein and wafers processed using a conventional method, which relies upon lapping with a free abrasive slurry rather than grinding. The comparative data is provided below in Table 5, units for TTV and Warp are microns, while the units for nTTV and nWarp are microns/cm$^2$ and diameter (d) and thickness (t) are provided in inches and microns, respectively.

TABLE 5

| | Comparative Examples | | | Examples | | |
|---|---|---|---|---|---|---|
| | d = 2", t = 430 μm | 3", 550 μm | 4", 650 μm | 2" | 3", 470 μm | 4", 470 μm |
| TTV | 1.77 | 1.452 | 3.125 | 0.95 | 1.7 | 1.25 |
| nTTV | 0.087 | 0.032 | 0.039 | 0.05 | 0.04 | 0.015 |
| Warp | 4.2 | 8.0 | n/a | 3.58 | 5.00 | 8.70 |
| nWarp | 0.207 | 0.175 | | 0.18 | 0.11 | 0.11 |

For all wafer diameters, the normal to the ground surface was less than 1 degree from the c-axis of the wafer.

Further, misorientation angles $\theta_M$ and $\theta_A$ of wafers among wafer lots were measured to detect the degree of wafer to wafer variance, quantified in terms of standard deviation $\sigma_M$ and $\sigma_A$. Results are show below in Table 6.

TABLE 6

| Misorientation Angle Standard Deviation σ | | |
|---|---|---|
| Conventional Process | New Process | % Improvement |
| $\sigma_M$ 0.018 | $\sigma_M$ 0.0069 | 61% |
| $\sigma_A$ 0.0347 | $\sigma_A$ 0.0232 | 33% |

Wafers processed according to the Examples exhibit improved dimensional geometry, particularly improved TTV, nTTV, Warp, and nWarp, and crystallographic accuracy in terms of misorientation angle standard deviation. Each of the values in Table 5 is an average of at least 8 data. The standard deviation values σ noted above in Table 6 were measured across various wafer lots from those made in accordance with the foregoing process flow and those from conventional processing that utilize a lapping for the entire grinding process. Notably, the Examples have improved dimensional geometry as quantified by the TTV and Warp values, typically achieved at wafer thicknesses less than those employed by conventional processing. Embodiments also provide improved control and consistency of dimensional geometry across each wafer, and crystallographic control over wafer lots. Moreover, the Examples provide improved scalability evidenced by the improved dimensional geometries as the diameter of the wafers increases.

While fixed abrasive grinding has been utilized in the context of finishing applications in general, the inventors have discovered that sapphire wafer processing with tight dimensional control was supported by particular process features. Conventional processing methods rely upon feed rates that are low and chuck speeds that are high for improved dimensional geometry. However, it was discovered that such low feed rates (e.g. 0.5 microns/s) and high chucks chuck speeds (e.g. 590 rpm) produce wafers having excessive nBow, nWarp, and/or nTTV. The reasons for the success of unconventional process conditions utilized hereinto increase dimensional control are not entirely understood but appear to be related particularly to machining of sapphire substrates and particularly to larger substrates, e.g., 3 inch and 4 inch sapphire substrates.

According to embodiments herein, high surface area, high quality, substrates are produced that support active device processing with notably high yield and productivity. The processing procedures provided herein present wafers with repeatable, highly dimensionally precise geometric crystallographic parameters. Moreover, embodiments provided herein provide a unique combination of processing techniques, parameters, chemistries, and apparatuses, that exhibit a deviation from the state of the art and conventional procedures to provide wafers having dramatically improved dimensional geometries and crystallographic accuracy.

The above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A sapphire substrate, comprising:
    a generally planar surface having a crystallographic orientation selected from the group consisting of a-plane, r-plane, m-plane, and c-plane orientation, and having a nTTV of not greater than about 0.032 μm/cm$^2$, wherein nTTV is total thickness variation normalized for surface area of the generally planar surface, the substrate having a diameter not less than about 9.0 cm.

2. The sapphire substrate of claim 1, wherein the generally planar surface has a roughness Ra not greater than about 10.0 Å.

3. The sapphire substrate of claim 1, wherein the substrate has a nFlatness of not greater than 0.100 μm/cm$^2$, wherein nFlatness is flatness of the generally planar surface normalized for surface area of the generally planar surface.

4. The sapphire substrate of claim 1, wherein the substrate has a nBow of not greater than 0.100 μm/cm$^2$, wherein nBow is bow of the substrate normalized for surface area of the generally planar surface.

5. The sapphire substrate of claim 1, wherein the substrate has a nWarp of not greater than 0.190 μm/cm$^2$, wherein nWarp is warp of the substrate normalized for surface area of the generally planar surface.

6. The sapphire substrate of claim 1, wherein the crystallographic orientation is selected from the group consisting of c- and r-plane orientations.

7. The sapphire substrate of claim 6, wherein the crystallographic orientation is the c-plane orientation.

8. The sapphire substrate of claim 7, wherein the generally planar surface of the sapphire substrate is tilted away from the c-plane at a tilt angle of not greater than about 2.0°.

9. The sapphire substrate of claim 1, wherein the generally planar surface of the sapphire substrate has a dislocation density of not greater than $1E8/cm^2$.

10. The sapphire substrate of claim 1, wherein the generally planar surface has a surface area of not less than about 70 $cm^2$.

11. The sapphire substrate of claim 1, wherein the substrate has a diameter of not less than about 10.0 cm.

12. A sapphire substrate, comprising:
a generally planar surface having a crystallographic orientation selected from the group consisting of a-plane, r-plane, m-plane, and c-plane orientation, and having a nFlatness of not greater than 0.100 $\mu m/cm^2$, wherein nFlatness is flatness of the generally planar surface normalized for surface area of the generally planar surface, and the substrate has a diameter not less than about 6.5 cm and a thickness not greater than about 525 $\mu m$.

13. The sapphire substrate of claim 12, wherein the TTV is not greater than about 2.85 $\mu m$.

14. The sapphire substrate of claim 12, wherein the thickness is not greater than about 500 $\mu m$.

15. The sapphire substrate of claim 12, wherein the generally planar surface has a roughness Ra not greater than about 5.0 Å.

16. The sapphire substrate of claim 12, wherein the substrate has a nBow of not greater than 0.100 $\mu m/cm^2$, wherein nBow is bow of the substrate normalized for surface area of the generally planar surface.

17. The sapphire substrate of claim 12, wherein the substrate has a nWarp of not greater than 0.190 $\mu m/cm^2$, wherein nWarp is warp of the substrate normalized for surface area of the generally planar surface.

18. The sapphire substrate of claim 12, wherein the crystallographic orientation is selected from the group consisting of c- and r-plane orientations.

19. The sapphire substrate of claim 18, wherein the crystallographic orientation is the c-plane orientation and the generally planar surface of the sapphire substrate is tilted away from the c-plane at a tilt angle of not greater than about 2.0°.

20. The sapphire substrate of claim 12, wherein the generally planar surface of the sapphire substrate has a dislocation density of not greater than $1E8/cm^2$ as measured by x-ray topography.

21. The sapphire substrate of claim 12, wherein the generally planar surface has a surface area of not less than about 40 $cm^2$.

22. The sapphire substrate of claim 12, wherein the substrate has a diameter of not less than about 7.5 cm.

23. A sapphire substrate, comprising:
a generally planar surface having a crystallographic orientation selected from the group consisting of a-plane, r-plane, m-plane, and c-plane, and having a nTTV of not greater than about 0.025 $\mu m/cm^2$, wherein nTTV is total thickness variation normalized for surface area of the generally planar surface.

24. The sapphire substrate of claim 23, wherein the nTTV is not greater than about 0.020.

25. The sapphire substrate of claim 23, wherein the nTTV is not greater than about 0.018.

26. The sapphire substrate of claim 23, wherein substrate has a diameter not less than about 9.0 cm.

* * * * *